US 7,594,201 B2

(12) United States Patent
Lahner et al.

(10) Patent No.: US 7,594,201 B2
(45) Date of Patent: Sep. 22, 2009

(54) ENHANCED METHOD OF OPTIMIZING MULTIPLEX STRUCTURES AND MULTIPLEX CONTROL STRUCTURES IN RTL CODE

(75) Inventors: Juergen Lahner, Morgan Hill, CA (US); Kiran Atmakuri, Sunnyvale, CA (US); Kavitha Chaturvedula, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 377 days.

(21) Appl. No.: 11/460,680

(22) Filed: Jul. 28, 2006

(65) Prior Publication Data

US 2006/0282801 A1 Dec. 14, 2006

Related U.S. Application Data

(63) Continuation-in-part of application No. 10/844,664, filed on May 12, 2004, now Pat. No. 7,086,015.

(51) Int. Cl.
    *G06F 17/50* (2006.01)
(52) U.S. Cl. .............. 716/2; 716/3; 716/7; 716/13
(58) Field of Classification Search ............ 716/1–4, 716/7, 12–14
    See application file for complete search history.

(56) References Cited

U.S. PATENT DOCUMENTS

| | | | | |
|---|---|---|---|---|
| 5,555,201 A | * | 9/1996 | Dangelo et al. | 716/1 |
| 5,623,418 A | * | 4/1997 | Rostoker et al. | 716/1 |
| 6,135,647 A | * | 10/2000 | Balakrishnan et al. | 716/18 |
| 6,173,435 B1 | * | 1/2001 | Dupenloup | 716/18 |
| 6,263,483 B1 | * | 7/2001 | Dupenloup | 716/18 |
| 6,289,498 B1 | * | 9/2001 | Dupenloup | 716/18 |
| 6,292,931 B1 | * | 9/2001 | Dupenloup | 716/18 |
| 6,295,636 B1 | * | 9/2001 | Dupenloup | 716/18 |
| 6,438,735 B1 | * | 8/2002 | McElvain et al. | 716/7 |
| 7,082,584 B2 | * | 7/2006 | Lahner et al. | 716/4 |
| 2003/0023941 A1 | * | 1/2003 | Wang et al. | 716/4 |
| 2003/0149945 A1 | * | 8/2003 | Abadir et al. | 716/3 |
| 2005/0268258 A1 | * | 12/2005 | Decker | 716/4 |

* cited by examiner

*Primary Examiner*—Sun J Lin
(74) *Attorney, Agent, or Firm*—Luedeka, Neely & Graham, P.C.

(57) ABSTRACT

A method and computer program are disclosed for optimizing RTL code for an integrated circuit design that include steps of method of optimizing register transfer level code for an integrated circuit design comprising steps of receiving as input a first register transfer level code for the integrated circuit design and receiving as input criteria defining a critical multiplex structure. The first register transfer level code is analyzed to identify multiplex structures in the first register transfer level code. Each of the multiplex structures identified in the first register transfer level code is compared to the criteria defining a critical multiplex structure. Each of the multiplex structures identified in the first register transfer level code that satisfy the criteria defining a critical multiplex structure is entered in a list of critical multiplex structures. The list of critical multiplex structures is generated as output.

28 Claims, 13 Drawing Sheets

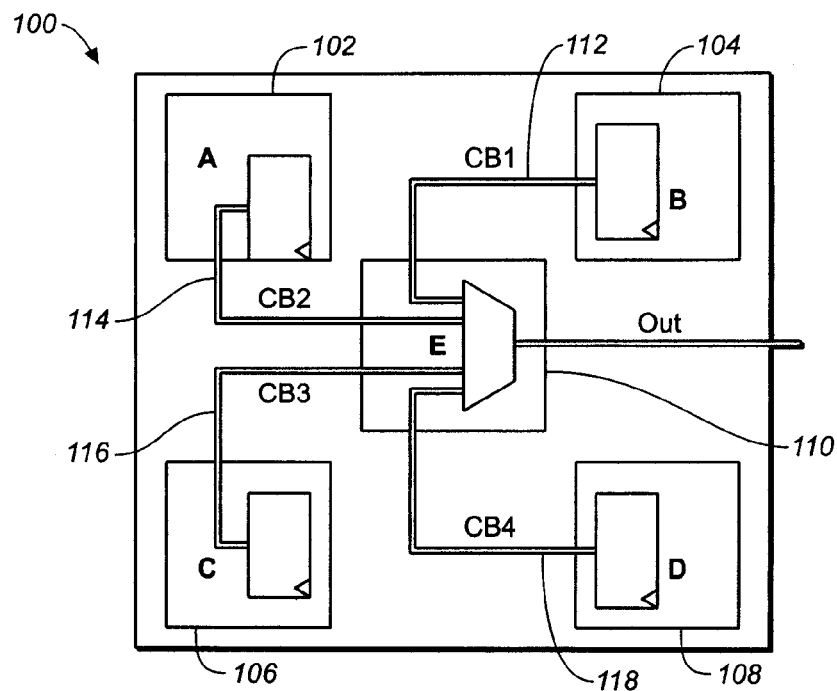
FIG._1
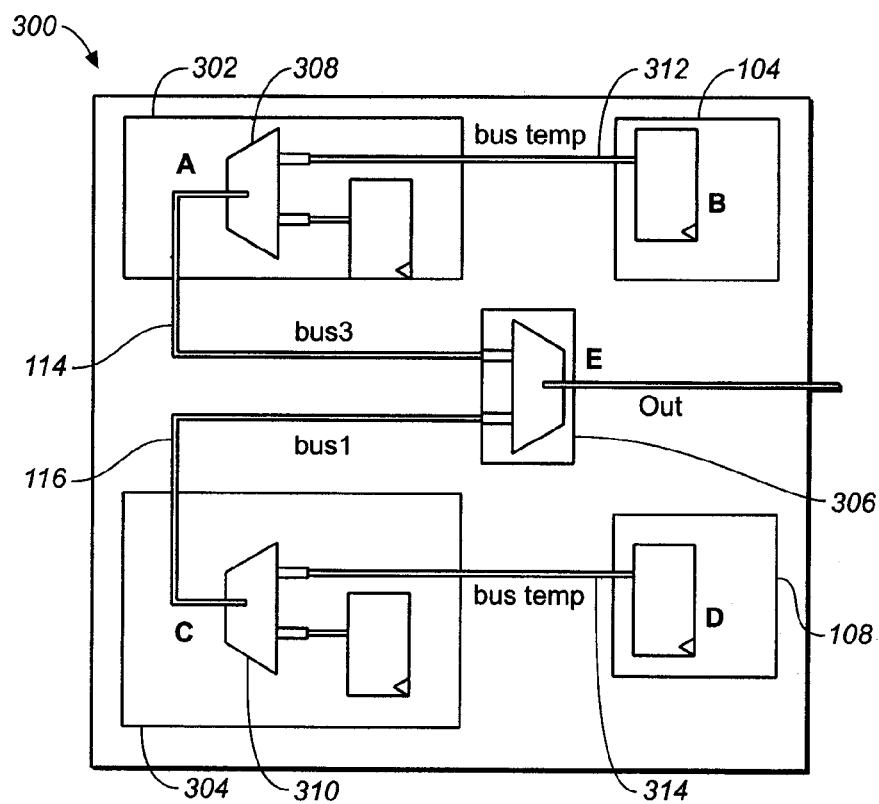
FIG._3

```
module E ( bus1, bus2, bus3, bus4 ,sel0,sel1, out ...)          ← 200
input [15:0] bus1, bus2, bus3, bus4;
input  sel0,sel1;
output [15:0 ] out;

always @ (bus1 or bus2 or bus3 or bus4 or sel )
assign sel = {sel1,sel0}
begin
case (sel)
00: out<= CB1;
01: out<= CB2;
10: out<= CB3;
11: out<= CB4;
endcase end endmodule module A ( bus1 ....);
output [15:0] bus1;

i u ( .. bus(bus1) ..)
..
endmodule module B ( bus2 ....);
output [15:0] bus2;

i u ( .. bus(bus2).. )
..
endmodule module C ( bus3 ....);
output [15:0] bus3;

i u ( .. bus(bus3).. )
..
endmodule module D ( bus4 ....);
output [15:0] bus4;

i u ( .. bus(bus4).. )
..
endmodule
```

FIG._2

```
module E { bus1,bus3,sel1, out ...}
input [15:0] bus1,bus3;
input sel1;
output [15:0 ] out;

always @ ( bus1 or bus3 or sel )
begin
case (sel)
0: out<= bus1;
1: out<= bus3;
endcase end endmodule module A ( bus1, bus2 ....sel0);
output [15:0] bus1;
input [15:0] bus2;

reg [15:0] bus1;
wire [15:0] bus_temp;
l u ( .. bus(bus_temp) )
case (sel0)
0: bus1 <= bus_temp;
1: bus1<= bus2;
endcase
..
endmodule module B (bus2 .....)

output [15:0] bus2;

l u ( .. bus(bus2).. )
endmodule module C ( bus3, bus4, sel0 ....);
output [15:0] bus3;
input  [15:0] bus4;
reg [15:0] bus3;
wire [15:0] bus_temp;
l u ( .. bus(bus_temp).. )
..
case (sel0)
0: bus3 <= bus_temp;
1: bus3<= bus4;
endmodule module D ( bus4 ....);
output [15:0] bus4;
.
l u ( .. bus(bus4).. )
..
endmodule
```

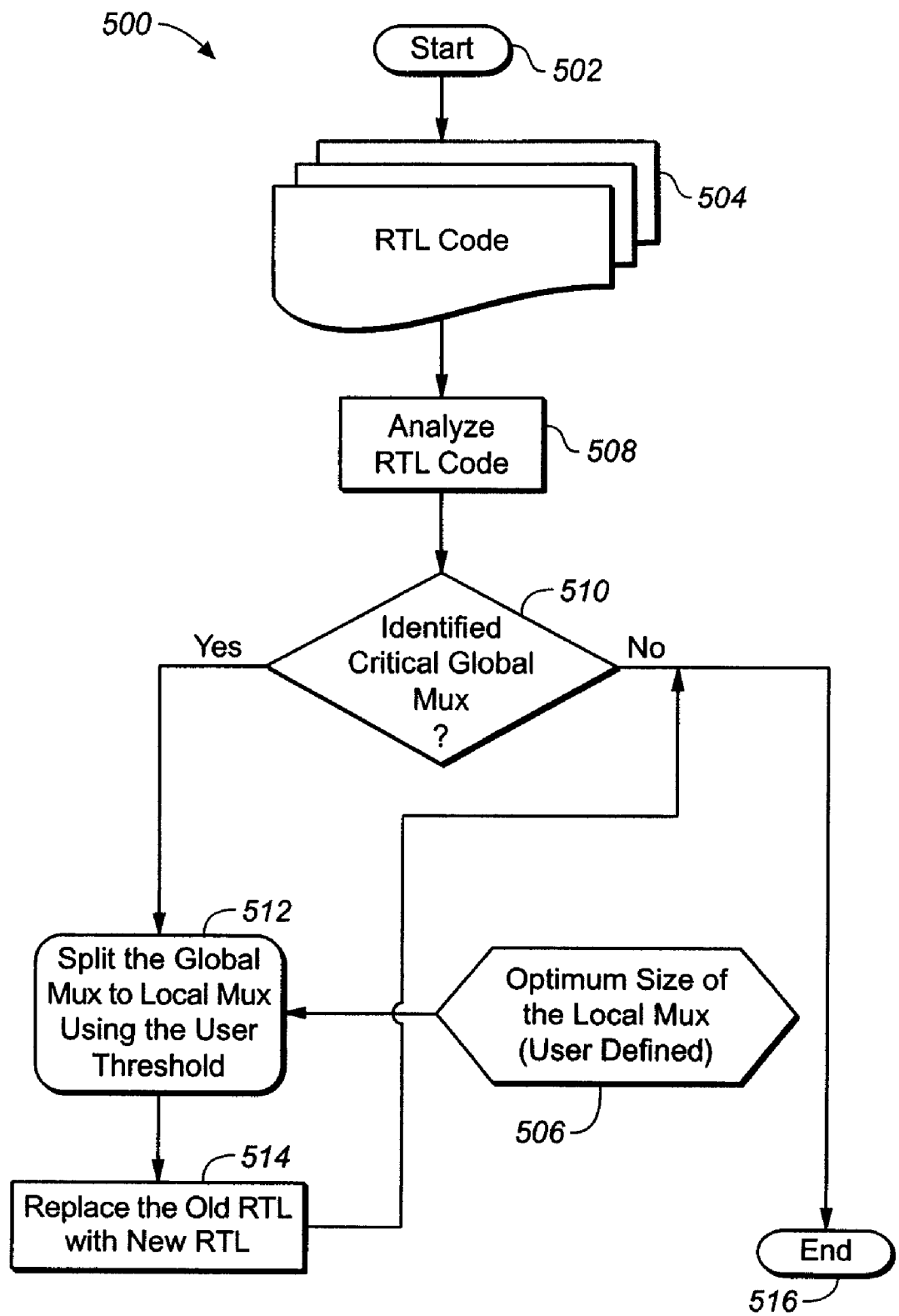
FIG._5

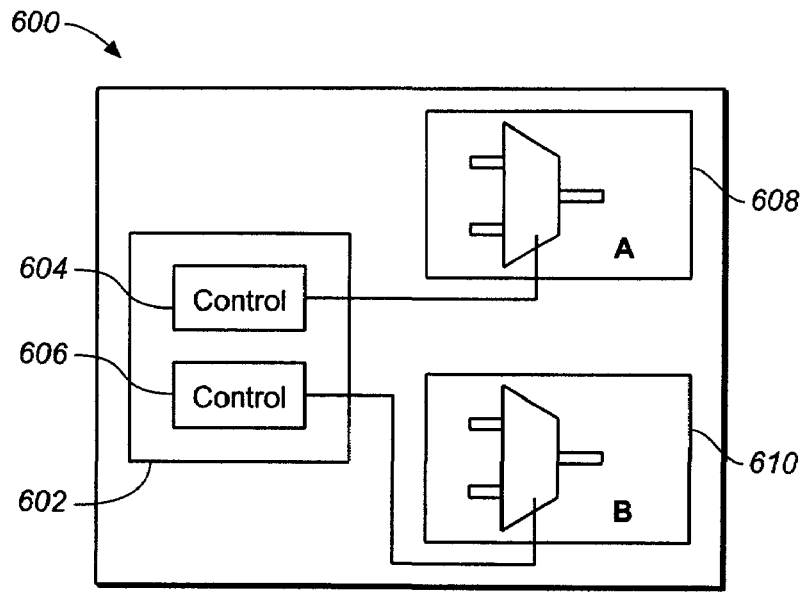
FIG._6
```
module main_control (
control_in1, control_in2,
control_out1, control_out2);
input control_in1, control_in2;
output control_out1, control_out2;
control c1 ( control_in1, control_out1)
control c2 ( control_in2, control_out2)
endmodule
module top ( .............)
main_control C (control_in1, control_in2,
control_out1, control_out2)
A instA ( control_out1, x, y, z ,f )
B instB (control_out2, x1 y1,z1, f1)
endmodule
```
⎵
700
FIG._7

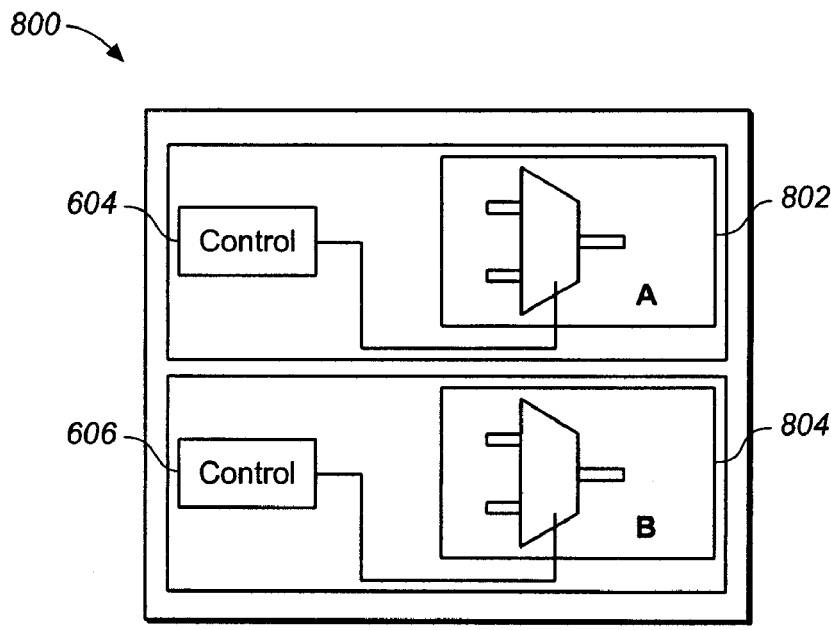
FIG._8
```
module top (.........)
NewA instA ( control_in1, x,y,z,f)
NewB  instB  ( control_in2, x, y, z, f)
endmodule
module NewA (control_in1, x,y,z,f)
control c1 ( control_in1, control_out1)
A  instA   ( control_out1, x, y, z ,f )
endmodule
module NewB   ( control_in2, x, y, z, f)
control c2 ( control_in2, control_out2)
B  instB   ( control_out2, x, y, z ,f )
endmodule
```
FIG._9

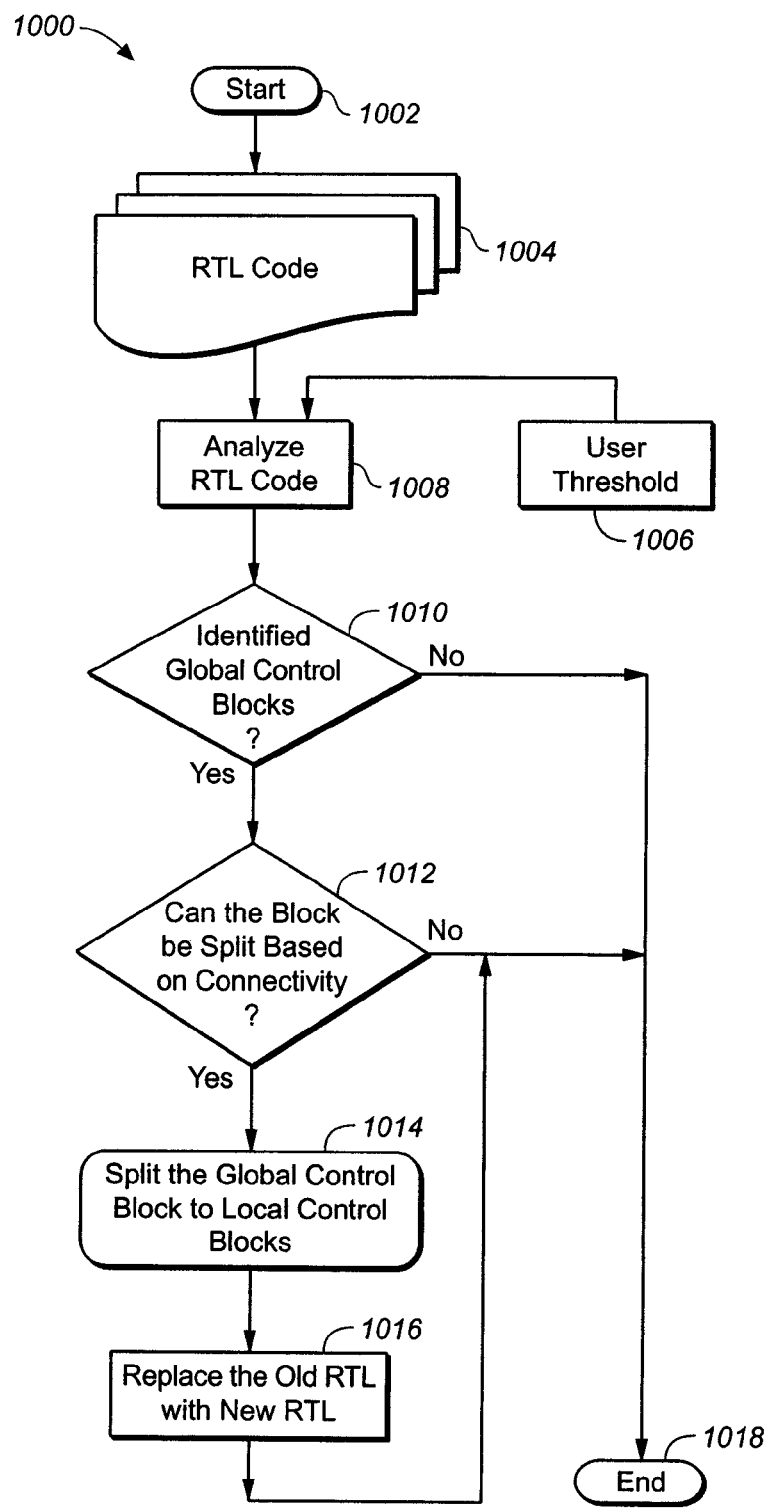
FIG._10

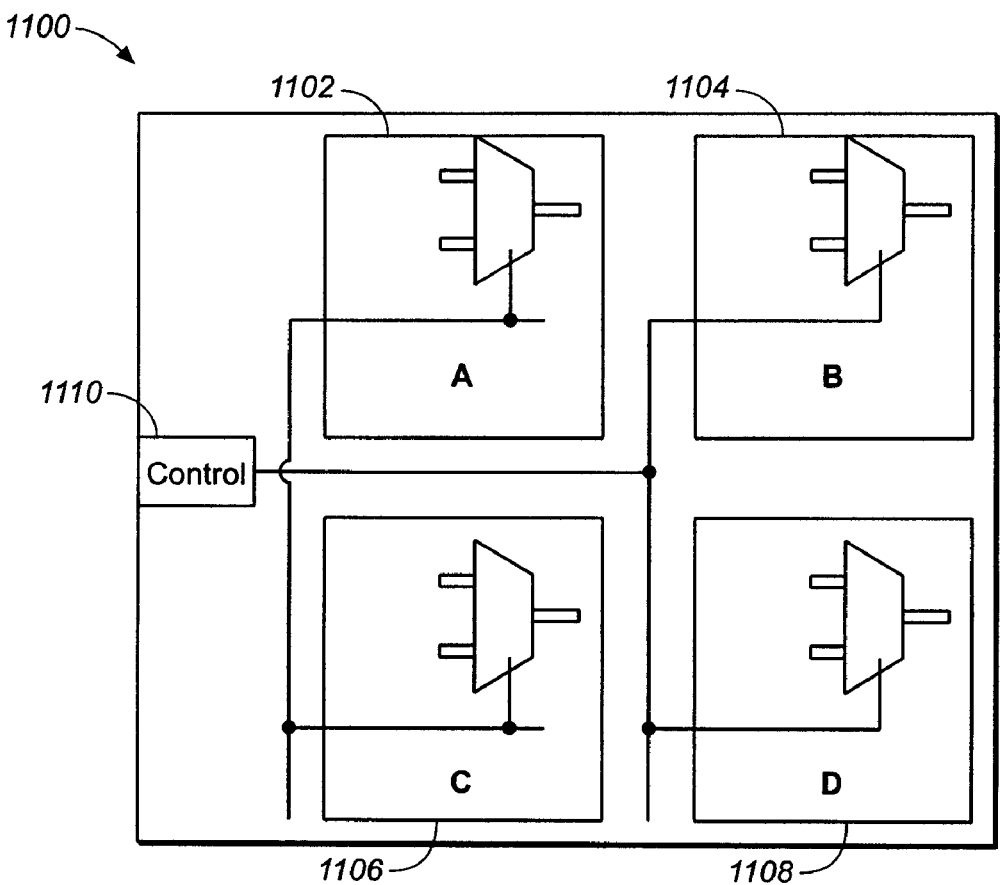
FIG._11
```
module top (....)
wire control_signal
ctrl c  ( ip, control_signal)
A u1 ( x, y, z, control_signal)
B u2 ( x1,y1,z1, control_signal)
C u3 ( x2, y2, z2, control_signal)
D u4 (x3,y3,z3, control_signal)
endmodule
```
FIG._12

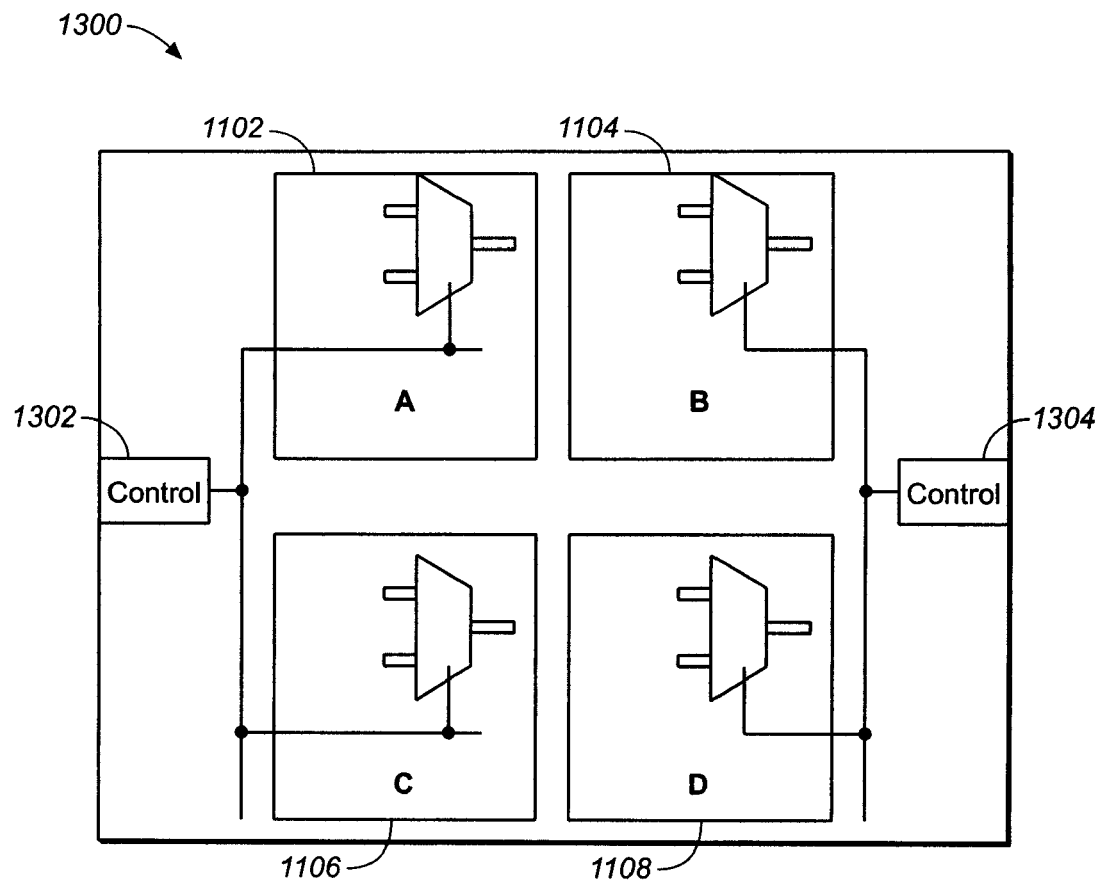
FIG._13
FIG._14

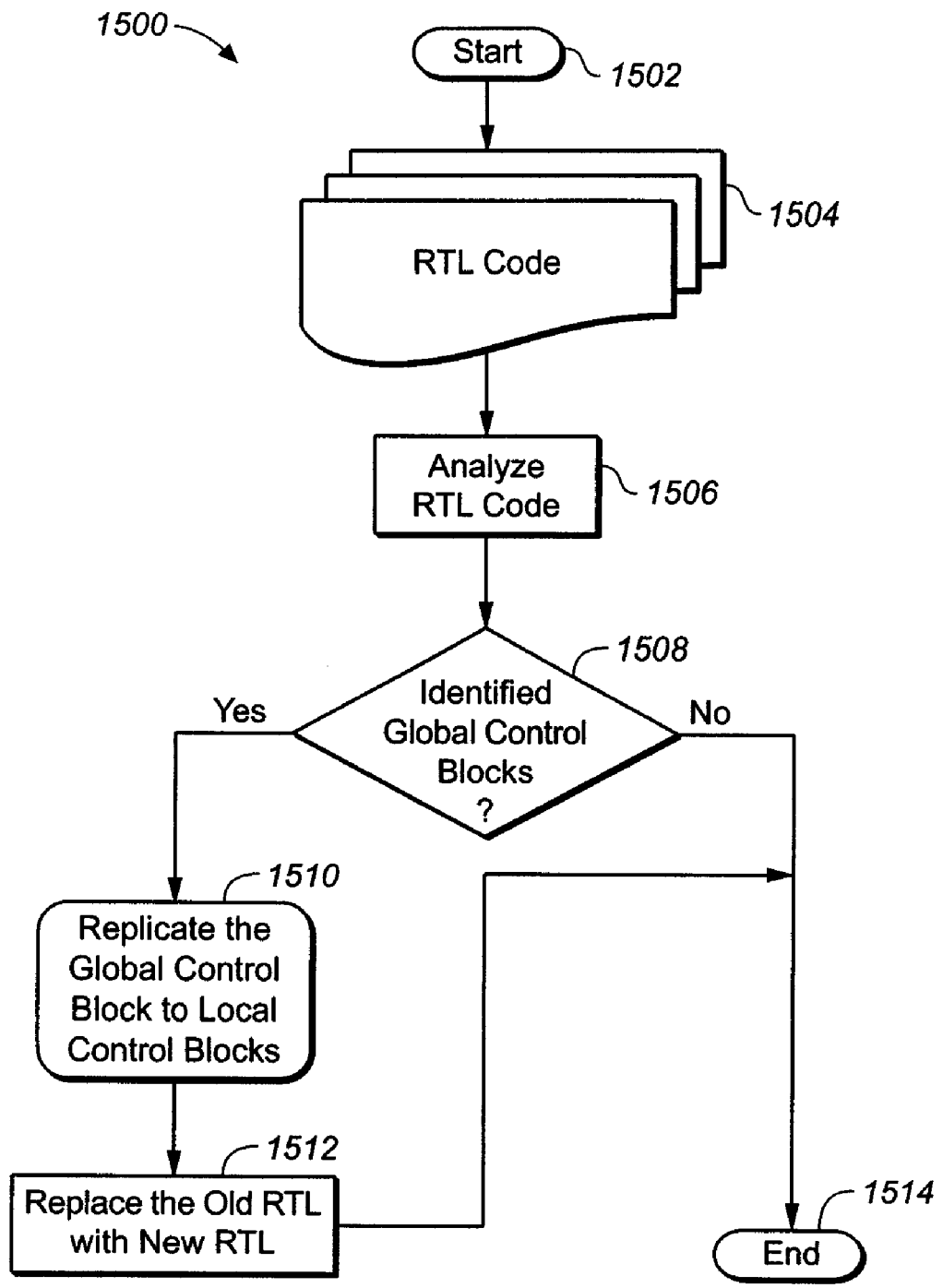
FIG._15

1600

| User defined variables | User defined thresholds | User defined priorities |
|---|---|---|
| Inputs ||| 
| Number of buses | 8 | 1 |
| Number of signals per bus | 32 | 3 |
| Number of total signals | 1024 | 2 |
| Number of register bank sources | 8 | 10 |
| Number of memory sources | 8 | 4 |
| Number of individual flip-flops | 100 | 7 |
| Number of start points | 200 | 6 |
| ……. | | |
| Outputs ||| 
| Number of end points | 1 | 5 |
| ….. | | |

FIG_16

1700

| | Inputs | | | | ….. | Outputs | …… |
| | Number of buses | Number of signals per bus | Number of total signals | Number of register bank sources | | Number of endpoints | |
|---|---|---|---|---|---|---|---|
| Mux 1 | 4 | 5 | 2 | 1 | | 1 | |
| Mux 2 | 5 | 6 | 3 | 4 | | 2 | |
| Mux 3 | 5 | 70 | 5 | 12 | | 1 | |
| …… | | | | | | | |

FIG_17

1800

| | Input Criteria | | | | … | Output Criteria | … |
| | Number of busses | Number of signal per bus | Number of total signals | Number of register bank sources | | Number of endpoints | |
|---|---|---|---|---|---|---|---|
| Mux1 | 4*1/Priority1 =4 | 5*1/Priority3 =1.67 | 2*1/Priority2 =1 | 1*1/Priority10= 0.1 | | 1*1/Priority 5 =0.2 | |

FIG_18

1900

| |
|---|
| Mux 2 |
| Mux 3 |
| … |

FIG_19

US 7,594,201 B2

ENHANCED METHOD OF OPTIMIZING MULTIPLEX STRUCTURES AND MULTIPLEX CONTROL STRUCTURES IN RTL CODE

CROSS-REFERENCE TO RELATED APPLICATIONS

This application is a continuation-in-part of U.S. patent application Ser. No. 10/844,664, filed on May 12, 2004, titled "METHOD OF OPTIMIZING RTL CODE FOR MULTIPLEX STRUCTURES", by Lahner et al., U.S. Pat. No. 7,086,015, the entirety of which is incorporated herein by reference.

BACKGROUND OF THE INVENTION

1. Field of the Invention

The present invention is directed to integrated circuit design software used in the manufacture of integrated circuits. More specifically, but without limitation thereto, the present invention is directed to avoiding timing and congestion problems in register transfer level (RTL) code for multiplex structures in an integrated circuit design.

2. Description of the Prior Art

Complex multiplex structures are one of the main causes of congestion problems in the layout of field programmable gate arrays (FPGAs), application specific integrated circuits (ASICs), and structured ASICs. In previous methods of checking for congestion problems, a netlist is generated from the register transfer level (RTL) code for the integrated circuit design by a layout tool to determine whether the netlist is routable. If not, then the RTL code is modified to relieve routing congestion and a new netlist is generated and checked, and so on, until a routable netlist is generated.

SUMMARY OF THE INVENTION

In one embodiment of the present invention, a method of optimizing RTL code for an integrated circuit design includes steps of:
  (a) receiving as input a first register transfer level code for the integrated circuit design;
  (b) receiving as input criteria defining a critical multiplex structure;
  (c) analyzing the first register transfer level code to identify multiplex structures in the first register transfer level code;
  (d) comparing each of the multiplex structures identified in the first register transfer level code to the criteria defining a critical multiplex structure;
  (e) including each of the multiplex structures identified in the first register transfer level code that satisfy the criteria defining a critical multiplex structure in a list of critical multiplex structures; and
  (f) generating as output the list of critical multiplex structures.

In another aspect of the present invention, a computer program product for optimizing RTL code for an integrated circuit design includes a medium for embodying a computer program for input to a computer and a computer program embodied in the medium for causing the computer to perform steps of:
  (a) receiving as input a first register transfer level code for the integrated circuit design;
  (b) receiving as input criteria defining a critical multiplex structure;
  (c) analyzing the first register transfer level code to identify multiplex structures in the first register transfer level code;
  (d) comparing each of the multiplex structures identified in the first register transfer level code to the criteria defining a critical multiplex structure;
  (e) including each of the multiplex structures identified in the first register transfer level code that satisfy the criteria defining a critical multiplex structure in a list of critical multiplex structures; and
  (f) generating as output the list of critical multiplex structures.

BRIEF DESCRIPTION OF THE DRAWINGS

The present invention is illustrated by way of example and not limitation in the accompanying figures, in which like references indicate similar elements throughout the several views of the drawings, and in which:

FIG. 1 illustrates an example of an integrated circuit design including a global multiplex structure;

FIG. 2 illustrates an example of RTL code for the integrated circuit design of FIG. 1;

FIG. 3 illustrates an example of an integrated circuit design after replacing the global multiplex structure of FIG. 1 with local multiplex structures;

FIG. 4 illustrates an example of RTL code for the integrated circuit design of FIG. 3;

FIG. 5 illustrates a flow chart of a method of replacing global multiplex structures with local multiplex structures in RTL code for an integrated circuit design;

FIG. 6 illustrates an example of a multiplex control block design for multiplex structures;

FIG. 7 illustrates an example of RTL code for the multiplex control block design of FIG. 6;

FIG. 8 illustrates an example of a multiplex control block design modified to split the multiplex control block of FIG. 6;

FIG. 9 illustrates an example of RTL code for the multiplex control block design of FIG. 8;

FIG. 10 illustrates a flow chart of a method of splitting a multiplex control block module and merging the control signals from the multiplex control blocks into modules containing multiplex structures in the RTL code of an integrated circuit design;

FIG. 11 illustrates an example of an integrated circuit design for identifying global control blocks;

FIG. 12 illustrates an example of RTL code for the integrated circuit design of FIG. 11;

FIG. 13 illustrates an example of an integrated circuit design modified from that of FIG. 11 to replace the global multiplex control block with local multiplex control blocks;

FIG. 14 illustrates an example of RTL code for replacing global multiplex control blocks with local multiplex control blocks;

FIG. 15 illustrates a flow chart of a method of replacing global multiplex control blocks with local multiplex control blocks;

FIG. 16 illustrates a table of criteria for defining a critical multiplex structure;

FIG. 17 illustrates a table for analyzing the multiplex structures in an integrated circuit design using the criteria of FIG. 16;

FIG. 18 illustrates a portion of the table of FIG. 17 after weighting the variable values for one of the multiplexer structures according to a variable weighting function of a priority value assigned to each of the variables;

FIG. 19 illustrates a list of critical multiplex structures determined from analysis of FIG. 17;

Figure 20:
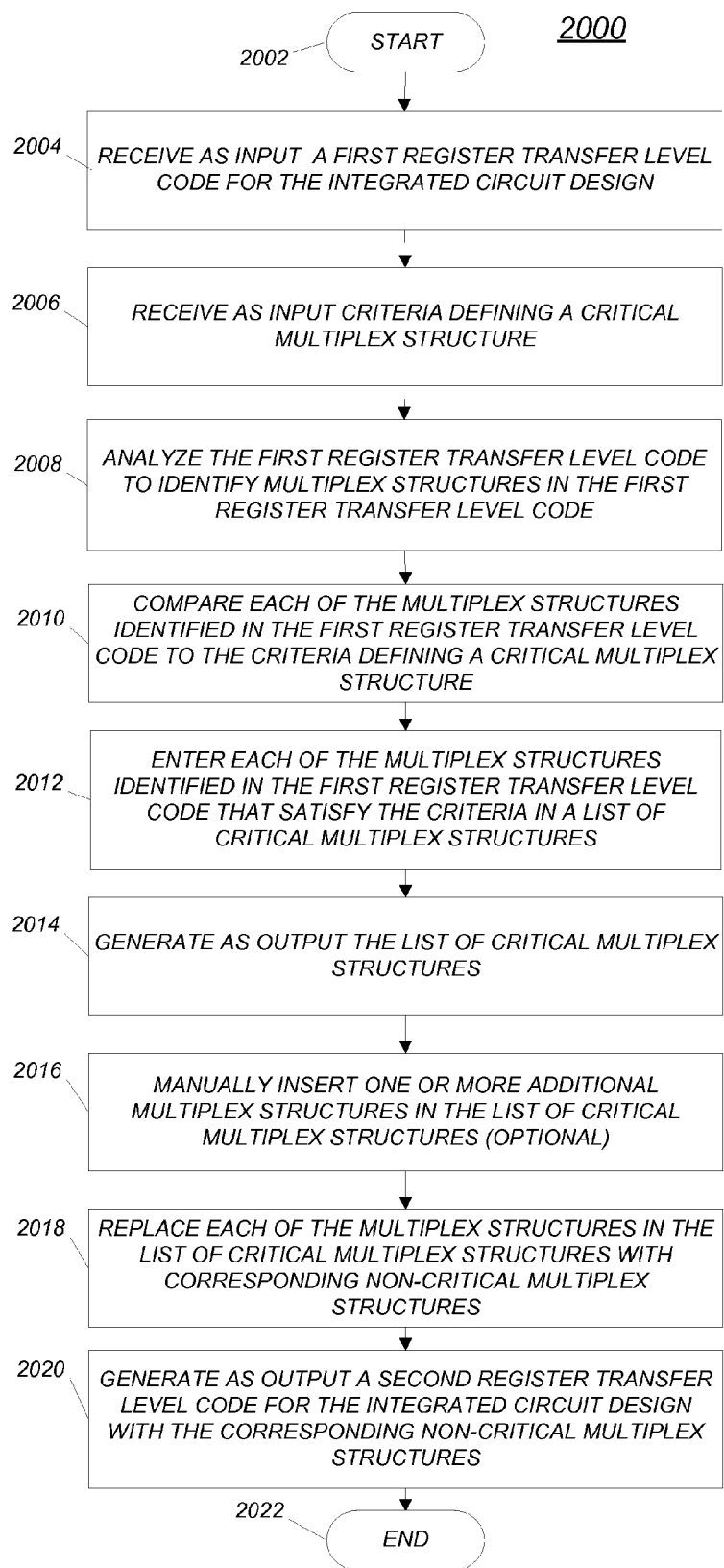
FIG. 20 illustrates a flow chart for an enhanced method of optimizing multiplex control structures in the RTL code of an integrated circuit design according to the criteria of FIG. 16.

Elements in the figures are illustrated for simplicity and clarity and have not necessarily been drawn to scale. For example, the dimensions of some elements in the figures may be exaggerated relative to other elements to point out distinctive features in the illustrated embodiments of the present invention.

DESCRIPTION OF THE ILLUSTRATED EMBODIMENTS

Complex multiplex structures and multiplex control structures in an integrated circuit design may significantly increase the turnaround time due to timing and routing congestion problems, if they are not properly designed at the RTL code level. In some cases, an integrated circuit design that includes a complex multiplex structure may be non-routable, in which case the product misses the market window and may ultimately be canceled, resulting in an expensive loss in valuable development time.

Complex multiplex structures in RTL code for an integrated circuit design that may result in a non-routable netlist are designated as critical multiplex structures. A critical multiplex structure is a multiplexer that satisfies criteria defined, for example, by the circuit designer. Conversely, a multiplex structure that does not satisfy the criteria are non-critical multiplex structures. Some examples of criteria that define a critical multiplexer are: a total number of signal lines that exceeds a user defined threshold, a number of signal buses in the multiplex structure that exceeds a user defined threshold, a signal bus bit width that exceeds a user defined threshold, and a number of multiplex structures in the integrated circuit design that exceeds a user defined threshold. For example, if the user defined threshold for the total number of signal lines is 48, then a 4-to-1 multiplexer having a 16-bit wide signal bus connected to four input signal buses and one output signal bus would have a total of 80 signal lines. The total number of 80 signal lines exceeds the user defined threshold of 48 signal lines, therefore the 4-to-1 multiplexer is identified as a critical multiplex structure. The user defined threshold for the number of signal lines depends on the specific application as a function of the configuration, on the integrated circuit manufacturing technology as a function of the timing and possible cycle time, on the required performance as a function of the timing and cycle time, and on the physical implications, that is, the multiplexer must be routable in the layout and the timing requirements must be satisfied.

Anticipating routing congestion problems at the RTL code level in integrated circuit designs having critical multiplex structures is desirable to avoid the adverse impact of routing congestion later in the integrated circuit design cycle. Once a netlist has been generated, there is no direct correlation between the netlist and the RTL code. Any netlist analysis of multiplex structures is extremely limited if not impossible, because only individual net violations are generally reported. Often, thousands of net violations would have to be analyzed to determine that they are all from the same multiplex structure. Even if a critical multiplex structure could be identified, it would still be necessary to modify the RTL code manually, which may also be a resource and time intensive process.

An important feature of the present invention is that multiplex structures are analyzed at the RTL code level, and critical multiplex structures may be automatically replaced with optimized multiplex structures to avoid routing congestion in placement and floorplanning of the integrated circuit design.

In one embodiment of the present invention, a method of optimizing RTL code for an integrated circuit design includes steps of:
  (a) receiving as input a first register transfer level code for the integrated circuit design;
  (b) receiving as input criteria defining a critical multiplex structure;
  (c) analyzing the first register transfer level code to identify all multiplex structures in the first register transfer level code;
  (d) comparing each of the multiplex structures identified in the first register transfer level code to the criteria defining a critical multiplex structure;
  (e) entering each of the multiplex structures identified in the first register transfer level code that satisfy the criteria defining a critical multiplex structure in a list of critical multiplex structures; and
  (f) generating as output the list of critical multiplex structures.

FIG. 1 illustrates an example of an integrated circuit design 100 including a global multiplex structure. Shown in FIG. 100 are a module A 102, a module B 104, a module C 106, a module D 108, a global multiplex structure module E 110, and signal buses 112, 114, 116 and 118.

In FIG. 1, all four signal buses 112, 114, 116 and 118 are received as input by the global multiplex structure module E 110. If the number of lines in each of the signal buses 112, 114, 116 and 118 times the number of signal buses exceeds a user defined threshold, then the global multiplex structure module E 110 is identified as a critical multiplex structure, that is, the resulting routing congestion would likely render the integrated circuit design non-routable.

FIG. 2 illustrates an example of RTL code 200 for the integrated circuit design 100 of FIG. 1. The RTL code may be generated, for example, according to well-known techniques in the art of integrated circuit design.

The RTL code for the global multiplex structure module E 110 defines a 4-to-1 multiplexer having a 16-bit wide signal bus. The module A 102, the module B 104, the module C 106, and the module D 108 are each defined having a 16-bit wide bus that is connected to the global multiplex structure module E 110.

The RTL code is analyzed to identify critical multiplex structures. Multiplex structures may be found either manually or automatically in an RTL code. To find multiplex structures manually, the RTL code may be loaded by a text editor and searched for Verilog or VHDL constructs that describe a multiplex structure. Alternatively, multiplex structures may be found in the RTL code and reported automatically by commercially available software in a list of all multiplexers for the integrated circuit design. Each multiplexer in the list of all multiplexers is compared to the criteria that define a critical multiplex structure. A set of tables may be compiled that includes the variables and the user thresholds that determine whether a multiplex structure is critical. The threshold values are based on, for example, a historical analysis of multiplex structures in designs to identify those that resulted in problems during layout, for example, routing congestion, timing problems, and problems related to test coverage and test vector generation. The historical information is used to determine the threshold values for critical multiplex structures in the RTL code.

After analyzing the RTL code, the global multiplex structure module E 110 is identified as a critical multiplex structure. The critical multiplex structure is replaced by a user defined optimum multiplex structure that does not exceed the criteria defining a critical multiplex structure. To achieve the identical function performed by the original multiplex structure, additional optimum multiplex structures are inserted locally in the modules downstream from the first optimum multiplex structure. The terms global and local are used to distinguish multiplex structures and multiplex control structures that are in the top level of the integrated circuit design or in a module or block at a lower level of the integrated circuit design. Preferably, the local optimum multiplex structures are inserted in such a way that the overall bus length is minimized.

FIG. 3 illustrates an example of an integrated circuit design 300 after replacing the global multiplex structure of FIG. 1 with local multiplex structures. Shown in FIG. 300 are a module B 104, a module D 108, a module A 302, a module C 304, signal buses 114 and 116, an optimum multiplex structure module E 306, local multiplex structures 308 and 310, and rerouted signal buses 312 and 314.

In FIG. 3, the global multiplex structure module E 110 in FIG. 1 has been replaced by the optimum multiplex structure module E 306, and the module A 302 and the module C 304 have been modified from the module A 102 and the module C 106 in FIG. 1 to include the local multiplex structures 308 and 310. The optimum multiplex structure module E 306 and the local multiplex structures 308 and 310 may be, for example, identical user defined optimum multiplex structures. In this example, the user defined optimum multiplex structures are 2-to-1 multiplexers having a 16-bit wide signal bus. Also, the signal buses 112 and 118 have been replaced by the rerouted signal buses 312 and 314, and the local multiplex structures 308 and 310 are placed in the module A 302 and the module C 304 to minimize the overall signal bus length. In this example, the multiplex structures that replace the global multiplex structure are placed in the same integrated circuit. In other embodiments, the replacement multiplex structures may be placed in a partition of the integrated circuit design.

FIG. 4 illustrates an example of RTL code 400 for the integrated circuit design 300 of FIG. 3. The RTL code for the user defined optimum multiplex structure module E 306 defines a 2-to-1 multiplexer having a 16-bit wide bus. The module A 102, the module B 104, the module C 106, and the module D 108 are each defined having a 16-bit wide bus that is connected to the user defined optimum multiplex structure module E 306.

The RTL code 400 of FIG. 4 reduces the peak routing congestion from four 16-bit wide signal buses to two 16-bit wide signal buses, thereby avoiding routing congestion that might result in a non-routable floorplan.

FIG. 5 illustrates a flow chart 500 of a method of replacing global multiplex structures with local multiplex structures in RTL code for an integrated circuit design.

Step 502 is the entry point of the flow chart 500.

In step 504, the RTL code of an integrated circuit design is received as input.

In step 506, a user threshold defining an optimum multiplex structure is received as input.

In step 508, the RTL code is analyzed manually or automatically as described above to identify critical multiplex structures.

In step 510, if a critical multiplex structure is identified in the RTL code, then control is transferred to step 512. Otherwise, no changes to the RTL code are needed, and control is transferred to step 516.

In step 512, the critical multiplex structure is partitioned into local multiplex structures defined by the user threshold.

In step 514, the RTL code of the modified integrated circuit design is generated as output that incorporates the local multiplex structures.

Step 516 is the exit point of the flow chart 500.

The method of FIG. 5 may be used for hierarchical or flat integrated circuit layouts. In hierarchical designs, routing congestion problems may be advantageously avoided by the optimized design that may be more easily processed by synthesis and layout tools. In flat designs, RTL code may still be optimized to reduce synthesis and layout tool computer run time with improved results, for example, priority synthesis, place and route handling for optimized multiplex structures, in which a synthesis or layout tool processes the optimized structures first to achieve the best possible results.

The multiplex control structures or blocks and the control signals that determine the state of the multiplex structures also play a key role in reducing timing problems and routing congestion in an integrated circuit design. After the RTL code has been optimized as described above with reference to FIG. 5, the RTL code may be further optimized to reduce timing problems and routing congestion due to the multiplexer control blocks and control signals as follows.

FIG. 6 illustrates an example of a multiplex control block design 600 for multiplex structures. Shown in FIG. 6 are a multiplex control block 602, multiplex control blocks 604 and 606, a module A 608, and a module B 610.

In FIG. 6, the multiplex control blocks 604 and 606 that control the state of the multiplex structures in the module A 608 and the module B 610 are placed within the separate control block module 602.

FIG. 7 illustrates an example of RTL code 700 for the control block design 600 of FIG. 6. The RTL code may be generated, for example, according to well-known techniques in the art of integrated circuit design.

The RTL code for the multiplex control block 602 includes the RTL code for the multiplex control blocks 604 and 606. If the number of control signals routed from the multiplex control block 602 exceeds a threshold value determined by the number of control nets or pins per instance or structure, then the multiplex control block 602 may be split to merge the multiplex control blocks 604 and 606 into the module A 608 and the module B 610 as follows.

FIG. 8 illustrates an example of a multiplex control block design 800 modified to split the multiplex control block 602 of FIG. 6. Shown in FIG. 8 are multiplex control blocks 604 and 606, a module A 802, and a module B 804.

In FIG. 8, the multiplex control blocks 604 and 606 have been merged into the module A 802 and the module B 804, thereby avoiding routing congestion resulting from the former multiplex control block 602.

FIG. 9 illustrates an example of RTL code 900 for the multiplex control block design 800 of FIG. 8. The RTL code 900 is generated by modifying the RTL code 700 so that the multiplex control block 604 is placed in the module A 802, and the multiplex control block 606 is placed in the module B 804.

The RTL code 900 of FIG. 9 advantageously avoids the routing congestion from the multiplex control block 602 in FIG. 6, thereby avoiding routing congestion that might result in a non-routable floorplan.

FIG. 10 illustrates a flow chart 1000 of a method of splitting a multiplex control block and merging the control signals from the multiplex control blocks into modules containing multiplex structures in the RTL code of an integrated circuit design.

Step 1002 is the entry point of the flow chart 1000.

In step 1004, the RTL code of an integrated circuit design is received as input.

In step 1006, a user threshold defining a threshold value for a critical number of multiplex control signals is received as input.

In step 1008, the RTL code is analyzed to identify multiplex control blocks having a number of multiplex control signals that exceeds the threshold value.

In step 1010, if a multiplex control block having a number of multiplex control signals that exceeds the threshold value is identified in the RTL code, then the multiplex control block is a critical multiplex control block, and control is transferred to step 1012. Otherwise, no changes to the RTL code are needed, and control is transferred to step 1018.

In step 1012, if the multiplex control block may be split based on its connections to other modules, then control is transferred to step 1014. For example, referring to FIG. 6, if there are no net connections between the multiplex control block 604 that controls the module A 608 or between the multiplex control block 606 that controls the module B 608, then the multiplex control block 602 may be split as illustrated in FIG. 8. Otherwise, control is transferred to step 1018.

In step 1014, the multiplex control block 602 is split, and the multiplex control blocks that generate the multiplex control signals are incorporated respectively into the modules containing the corresponding multiplex structures.

In step 1016, the RTL code of the modified multiplex control block design is generated as output that merges the multiplex control blocks into the modules containing the corresponding multiplex structures.

Step 1018 is the exit point of the flow chart 1000.

The method of FIG. 10 may be used for hierarchical or flat integrated circuit layouts. In hierarchical designs, routing congestion problems may be advantageously avoided by the optimized design that may be more easily processed by synthesis and layout tools. In flat designs, RTL code may still be optimized to reduce synthesis and layout tool computer run time with improved results, for example, priority synthesis, place and route handling for optimized multiplex structures, in which a synthesis or layout tool processes the optimized structures first to achieve the best possible results.

Alternatively, routing congestion resulting from multiplex control signals at multiplex control blocks may be advantageously reduced by replacing global multiplex control blocks with local multiplex control blocks as follows.

FIG. 11 illustrates an example of an integrated circuit design 1100 for identifying global multiplex control blocks. Shown in FIG. 1100 are a module A 1102, a module B 1104, a module C 1106, a module D 1108, and a global multiplex control block 1110.

In FIG. 11, the multiplex control signals for the module A 1102, the module B 1104, the module C 1106, and the module D 1108 are all generated by the global multiplex control block 1110. As a result, there may be routing congestion at the global multiplex control block 1110. The terms block, module, and structure are used interchangeably to denote a functional unit in an integrated circuit design.

FIG. 12 illustrates an example of RTL code 1200 for the integrated circuit design 1100 of FIG. 11. The RTL code may be generated, for example, according to well-known techniques in the art of integrated circuit design.

The RTL code 1200 for the integrated circuit design 1100 of FIG. 11 defines the number of multiplex control signals generated by the global multiplex control block 1110. If the number of multiplex control signals routed from the global multiplex control block 1110 exceeds a threshold value, then the global multiplex control block 1110 may be replaced by local multiplex control blocks to reduce routing congestion as follows.

FIG. 13 illustrates an example of an integrated circuit design 1300 modified from that of FIG. 11 to replace the global multiplex control block 1110 with local multiplex control blocks. Shown in FIG. 13 are a module A 1102, a module B 1104, a module C 1106, a module D 1108, and local multiplex control blocks 1302 and 1304.

In FIG. 13, the multiplex control signals for the module A 1102, the module B 1104, the module C 1106, and the module D 1108 are divided between the local multiplex control blocks 1302 and 1304. The local multiplex control blocks 1302 and 1304 may be, for example, identical replicas of the global multiplex control block 1110 in FIG. 11. The local multiplex control blocks 1302 and 1304 may be placed in the integrated circuit design 1300 to advantageously avoid routing congestion of the multiplex control signals inside the integrated circuit design 1300.

FIG. 14 illustrates an example of RTL code 1400 for replacing global multiplex control blocks with local multiplex control blocks. The RTL code 1400 is generated by modifying the RTL code 1200 so that the global multiplex control block 1110 is replaced by splitting the global multiplex control block 1110 into two local multiplex control blocks ctrl c1 and ctrl c2.

The RTL code 1400 of FIG. 14 advantageously avoids the routing congestion from the global multiplex control block 1110 in FIG. 11, thereby avoiding routing congestion that might result in a non-routable floorplan.

FIG. 15 illustrates a flow chart 1500 of a method of replacing global multiplex control blocks with local multiplex control blocks.

Step 1502 is the entry point of the flow chart 1500.

In step 1504, the RTL code of an integrated circuit design is received as input.

In step 1506, the RTL code is analyzed to identify global multiplex control blocks.

In step 1508, if a global multiplex control block is identified in the RTL code, then control is transferred to step 1510. Otherwise, no changes to the RTL code are needed, and control is transferred to step 1514.

In step 1510, the global multiplex control block is replaced with local multiplex control blocks in the integrated circuit design. Each local multiplex control block has a flip flop that receives the same clock signal to ensure that the multiplex control signals generated by the local multiplex control blocks are identical to that generated by the global multiplex control block replaced by the local multiplex control blocks.

In step 1512, the RTL code of the modified integrated circuit design is generated as output that replaces the global multiplex control blocks with the local multiplex control blocks.

Step 1514 is the exit point of the flow chart 1000.

The method of FIG. 15 may be used for hierarchical or flat integrated circuit layouts. In hierarchical designs, routing congestion problems may be advantageously avoided by the optimized design that may be more easily processed by synthesis and layout tools. In flat designs, RTL code may still be optimized to reduce synthesis and layout tool computer run time with improved results, for example, in priority synthesis, that is, place and route handling for optimized multiplex control structures, in which a synthesis or layout tool processes the optimized structures first to achieve the best possible results.

In another embodiment, an enhanced method of optimizing RTL code for an integrated circuit design includes steps of:

(a) receiving as input a first register transfer level code for the integrated circuit design;

(b) receiving as input criteria defining a critical multiplex structure;

(c) analyzing the first register transfer level code to identify multiplex structures in the first register transfer level code;

(d) comparing each of the multiplex structures identified in the first register transfer level code to the criteria defining a critical multiplex structure;

(e) entering each of the multiplex structures identified in the first register transfer level code that satisfy the criteria defining a critical multiplex structure in a list of critical multiplex structures; and (f) generating as output the list of critical multiplex structures.

FIG. 16 illustrates a table 1600 of criteria for defining a critical multiplex structure. The criteria include user defined variables for the inputs and the outputs of a multiplex structure, a user defined threshold for each of the variables, and a user defined priority for each of the variables. In this example, the user defined variables include a number of buses, a number of signals per bus, a total number of signals, a number of register bank sources, a number of memory sources, a number of flip-flops, a number of start points, and a number of endpoints.

An organized set or group of signals that is received as input by a multiplexer is called a bus. Buses usually originate from the same start point and stop at the same end point. The number of buses is the number of groups of signals. The number of signals per bus is the number of bits or lines in the bus. A register bank source is an organized set or group of flip-flops, in contrast to individual flip-flops that are not directly related to one another.

The number of buses in the RTL code may be found, for example, by searching the RTL code for multiple signals that have the same name. The number of signals per bus may be automatically determined from the RTL code by the counting the number of signals associated with the same name, for example: signal[0], signal[1], . . . signal[n], would be a bus having n signals, and so on. The total number of signals for each multiplexer may be found from the RTL code, for example, by counting the number of signals received by the multiplexer. The number of register bank sources may be found from the RTL code, for example, by searching the list of start points for multiple flip-flops having the same name. The number of individual flip-flops may be found from the RTL code, for example, by searching the list of start points for flip-flops that do not share the same name with any other flip-flop. The number of start points may be found from the RTL code, for example, by tracing each input signal from the multiplexer forward to a primary chip level input, flip-flop, or memory cell. The primary input, flip-flop, or memory cell is counted as a start point. The procedure is repeated for each input signal, and the total count is the number of start points. The number of end points may be found from the RTL code, for example, by tracing each output signal from the multiplexer backward to a primary chip level output, flip-flop, or memory cell. The primary output, flip-flop, or memory cell is counted as an end point. The procedure is repeated for each output signal, and the total count is the number of end points.

In like manner, search algorithms to find the values of user defined variables from the RTL code may be scripted according to well-known programming techniques. The values of all the variables determined from the RTL code for each multiplexer may be stored in a database. Alternatively, commercially available RTL code analysis software with forward and backward tracing capability may be used to generate a complete database from which the values of all the variables may be extracted.

For each of the user defined variables in the table 1600, there is a corresponding user defined threshold. If any of the user defined variables has a value in a multiplex structure that exceeds the corresponding user defined threshold, then the criteria defining a critical multiplexer are satisfied, and the multiplex structure is a critical multiplex structure. If none of the user defined variables has a value in the multiplex structure that exceeds the corresponding user defined threshold, then the criteria defining a critical multiplexer are not satisfied, and the multiplex structure is a non-critical multiplex structure.

FIG. 17 illustrates a table 1700 for analyzing the multiplex structures in an integrated circuit design using the criteria of FIG. 16. The values of the user defined variables for each of the multiplexer structures in the RTL code of an integrated circuit design is inserted in the table 1700 from the RTL code according to well-known techniques.

FIG. 18 illustrates a portion of the table 1700 of FIG. 17 after weighting the variable values for one of the multiplexer structures according to a variable weighting function of a priority value assigned to each of the variables. In this example, the priority has a value in the range from 1 to 10, and the variable weighting function is the reciprocal of the priority value. The term variable weighting function means that different priority values result in different weight values. For example, applying the priority values 1, 3, 2, 10, and 5 in FIG. 17 to the variable values for multiplexer 1 in FIG. 18 result in the weight values 1, 1/3, 1/2, 1/10, and 1/5, respectively. The variable weighting function may be optionally applied to one or more of the multiplexer entries in table 1700 of FIG. 17 to suit specific applications of the method of RTL code optimization.

FIG. 19 illustrates a list of critical multiplex structures from the analysis of FIG. 17. Using the weighted values of the variables for multiplexer 1, none of the threshold values are exceeded. Accordingly, multiplexer 1 is a non-critical multiplexer. On the other hand, multiplexer 2 is a critical multiplexer because it exceeds the threshold for the number of endpoints. Likewise, multiplexer 3 is a critical multiplexer because it exceeds the threshold for the number of signals per bus.

FIG. 20 illustrates a flow chart 2000 for an enhanced method of optimizing multiplex control structures in the RTL code of an integrated circuit design according to the criteria of FIG. 16.

Step 2002 is the entry point of the flow chart 2000.

In step 2004, a first register transfer level code for the integrated circuit design is received as input according to well known techniques.

In step 2006, criteria defining a critical multiplex structure are received as input. The criteria preferably include a number of variables and a threshold value for each of the variables.

In step 2008, the first register transfer level code is analyzed to identify the multiplex structures in the first register transfer level code, for example, by commercially available integrated circuit design software.

In step 2010, each of the multiplex structures identified in the first register transfer level code is compared to the criteria defining a critical multiplex structure as described above.

In step 2012, each of the multiplex structures identified in the first register transfer level code that satisfy the criteria defining a critical multiplex structure is entered in a list of critical multiplex structures.

In step 2014, the list of critical multiplex structures is generated as output. The appended claims contemplate all methods that include at least steps 2004 through 2014.

In step 2016, one or more additional multiplex structures may be inserted manually in the list of critical multiplex structures if desired by the circuit designer.

In step 2018, each of the multiplex structures in the list of critical multiplex structures is replaced in the integrated circuit design with corresponding non-critical multiplex structures as described above with regard to FIG. 3. The non-critical multiplex structures are preferably user defined optimum multiplex structures selected by the circuit designer according to the chip technology and the application. The non-critical multiplex structures may be either global or local multiplex structures.

In step 2020, a second register transfer level code for the integrated circuit design is generated as output with the corresponding non-critical multiplex structures.

By way of example, a variable may be included in the criteria defining a critical multiplex structure for one or more of a number of buses, a number of signals per bus, a total number of signals, a number of register bank sources, a number of memory sources, a number of flip-flops, a number of start points, and a number of endpoints. Each of the variables may be weighted by a variable function of a priority value assigned to the variable as described above.

Step 2022 is the exit point of the flow chart 2000.

The steps described above with regard to the flow chart 2000 may also be implemented by instructions performed on a computer according to well-known programming techniques.

In a further embodiment of the present invention, a computer program product for optimizing RTL code for an integrated circuit design includes a medium for embodying a computer program for input to a computer and a computer program embodied in the medium for causing the computer to perform steps of:

(a) receiving as input a first register transfer level code for the integrated circuit design;
(b) receiving as input criteria defining a critical multiplex structure;
(c) analyzing the first register transfer level code to identify multiplex structures in the first register transfer level code;
(d) comparing each of the multiplex structures identified in the first register transfer level code to the criteria defining a critical multiplex structure;
(e) entering each of the multiplex structures identified in the first register transfer level code that satisfy the criteria defining a critical multiplex structure in a list of critical multiplex structures; and
(f) generating as output the list of critical multiplex structures.

The multiplex control structures that generate the control signals for switching the multiplex structures may be analyzed in the same manner as the multiplex structures to identify critical multiplex control structures and to replace the critical multiplex control structures with non-critical multiplex control structures. Examples of variables for criteria defining critical multiplex control structures are the same as described above for multiplex structures.

In another embodiment, an enhanced method of optimizing RTL code for an integrated circuit design includes steps of:

(a) receiving as input a first register transfer level code for the integrated circuit design;
(b) receiving as input criteria defining a critical multiplex control structure;
(c) analyzing the first register transfer level code to identify multiplex control structures in the first register transfer level code;
(d) comparing each of the multiplex control structures identified in the first register transfer level code to the criteria defining a critical multiplex control structure;
(e) entering each of the multiplex control structures identified in the first register transfer level code that satisfy the criteria defining a critical multiplex control structure in a list of critical multiplex control structures; and
(f) generating as output the list of critical multiplex control structures.

Figure 21:
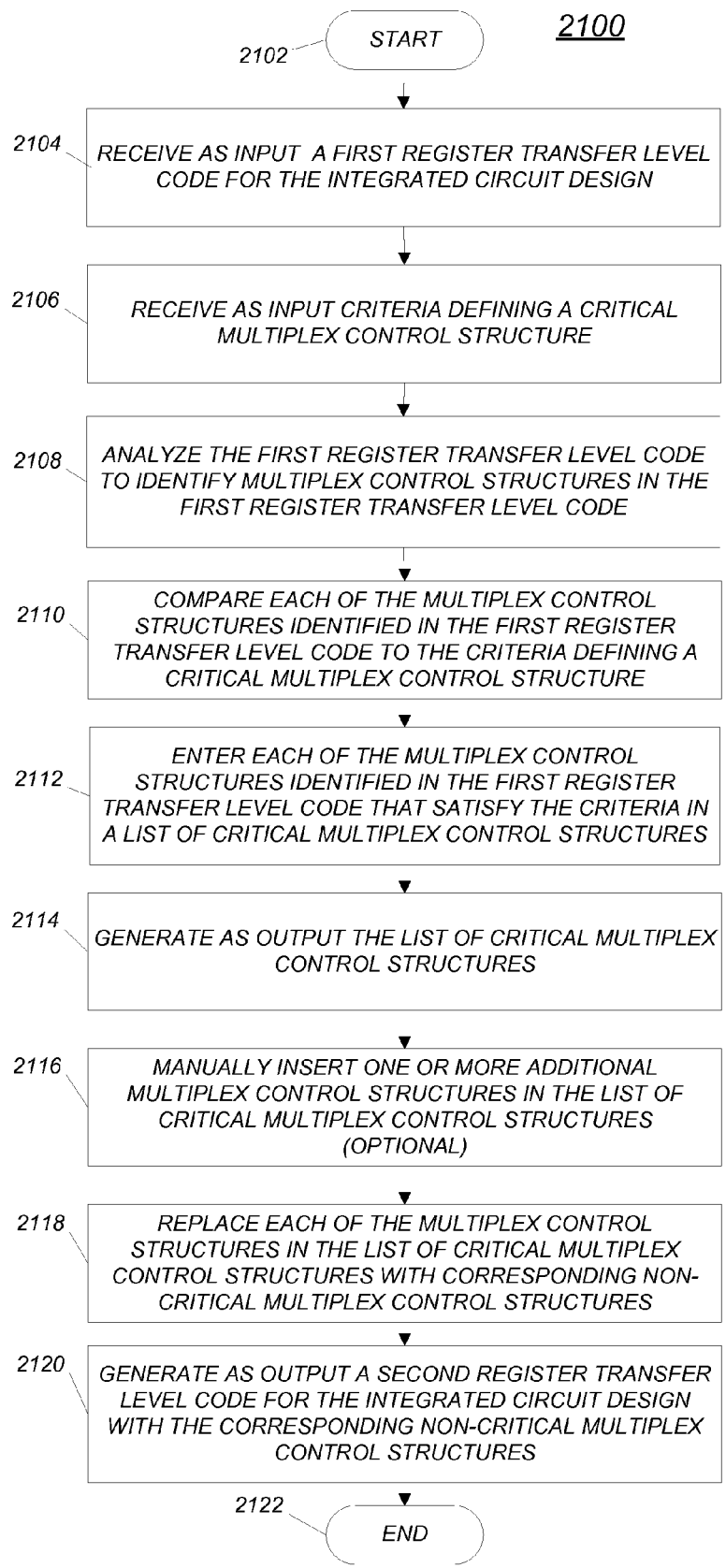
FIG. 21 illustrates a flow chart for an enhanced method of optimizing multiplex control structures in the RTL code of an integrated circuit design.

FIG. 21 illustrates a flow chart 2100 for an enhanced method of optimizing multiplex control structures in the RTL code of an integrated circuit design.

Step 2102 is the entry point of the flow chart 2100.

In step 2104, a first register transfer level code for the integrated circuit design is received as input according to well known techniques.

In step 2106, criteria defining a critical multiplex control structure are received as input. The criteria preferably include a number of variables and a threshold value for each of the variables.

In step 2108, the first register transfer level code is analyzed to identify the multiplex control structures in the first register transfer level code, for example, by commercially available integrated circuit design software.

In step 2110, each of the multiplex control structures identified in the first register transfer level code is compared to the criteria defining a critical multiplex control structure as described above.

In step 2112, each of the multiplex control structures identified in the first register transfer level code that satisfy the criteria defining a critical multiplex control structure is entered in a list of critical multiplex control structures.

In step 2114, the list of critical multiplex control structures is generated as output. The appended claims contemplate all methods that include at least steps 2104 through 2114.

In step 2116, one or more additional multiplex control structures may be inserted manually in the list of critical multiplex structures if desired by the circuit designer.

In step 2118, each of the multiplex control structures in the list of critical multiplex structures is replaced in the integrated circuit design with corresponding non-critical multiplex control structures as described above with regard to FIG. 8. The non-critical multiplex control structures are preferably user defined optimum multiplex control structures selected by the circuit designer according to the chip technology and the application. The non-critical multiplex control structures may be either global or local multiplex control structures.

In step 2120, a second register transfer level code for the integrated circuit design is generated as output with the corresponding non-critical multiplex control structures.

By way of example, a variable may be included in the criteria defining a critical multiplex control structure for one or more of a number of buses, a number of signals per bus, a total number of signals, a number of register bank sources, a number of memory sources, a number of flip-flops, a number of start points, and a number of endpoints. Each of the variables may be weighted by a variable function of a priority value assigned to the variable as described above. Each of the variables may be weighted by a variable function of a priority value assigned to the variable as described above.

Step 2122 is the exit point of the flow chart 2100.

The steps described above with regard to the flow chart 2100 may also be implemented by instructions performed on a computer according to well-known programming techniques.

In a further embodiment of the present invention, a computer program product for optimizing RTL code for an integrated circuit design includes a medium for embodying a computer program for input to a computer and a computer program embodied in the medium for causing the computer to perform steps of:

(a) receiving as input a first register transfer level code for the integrated circuit design;

(b) receiving as input criteria defining a critical multiplex control structure;

(c) analyzing the first register transfer level code to identify multiplex control structures in the first register transfer level code;

(d) comparing each of the multiplex control structures identified in the first register transfer level code to the criteria defining a critical multiplex control structure;

(e) entering each of the multiplex control structures identified in the first register transfer level code that satisfy the criteria defining a critical multiplex control structure in a list of critical multiplex control structures; and (f) generating as output the list of critical multiplex control structures.

Although the method of the present invention illustrated by the flowchart descriptions above are described and shown with reference to specific steps performed in a specific order, these steps may be combined, sub-divided, or reordered without departing from the scope of the claims. Unless specifically indicated herein, the order and grouping of steps is not a limitation of the present invention.

While the invention herein disclosed has been described by means of specific embodiments and applications thereof, numerous modifications and variations could be made thereto by those skilled in the art without departing from the scope of the invention set forth in the following claims.

What is claimed is:

1. A method of optimizing register transfer level code for an integrated circuit design by a computer system comprising steps of:

(a) receiving as input of the computer system a first register transfer level code for the integrated circuit design;

(b) receiving as input criteria defining a critical multiplex structure;

(c) analyzing the first register transfer level code to identify multiplex structures in the first register transfer level code;

(d) comparing each of the multiplex structures identified in the first register transfer level code to the criteria defining a critical multiplex structure;

(e) including each of the multiplex structures identified in the first register transfer level code that satisfy the criteria defining a critical multiplex structure in a list of critical multiplex structures; and (f) generating as output the list of critical multiplex structures.

2. The method of claim 1 further comprising a step of manually entering a multiplex structure in the list of critical multiplex structures.

3. The method of claim 1 further comprising a step of replacing each of the multiplex structures in the list of critical multiplex structures with corresponding noncritical multiplex structures.

4. The method of claim 3 further comprising a step of generating as output a second register transfer level code for the integrated circuit design with the corresponding noncritical multiplex structures.

5. The method of claim 1 further comprising including a variable and a threshold value for each variable in the criteria defining a critical multiplex structure.

6. The method of claim 5 further comprising including a variable in the criteria defining a critical multiplex structure for at least one of a number of buses, a number of signals per bus, a total number of signals, a number of register bank sources, a number of memory sources, a number of flip-flops, a number of start points, and a number of endpoints.

7. The method of claim 5 further comprising weighting the variable by a variable function of a priority value assigned to the variable.

8. A method of optimizing register transfer level code for an integrated circuit design by a computer system comprising steps of:

(a) receiving as input of the computer system a first register transfer level code for the integrated circuit design;

(b) receiving as input criteria defining a critical multiplex control structure;

(c) analyzing the first register transfer level code to identify multiplex control structures in the first register transfer level code;

(d) comparing each of the multiplex control structures identified in the first register transfer level code to the criteria defining a critical multiplex control structure;

(e) entering each of the multiplex control structures identified in the first register transfer level code that satisfy the criteria defining a critical multiplex control structure in a list of critical multiplex control structures; and (f) generating as output the list of critical multiplex control structures.

9. The method of claim 8 further comprising a step of manually entering a multiplex control structure in the list of critical multiplex control structures.

10. The method of claim 8 further comprising a step of replacing each of the multiplex control structures in the list of critical multiplex control structures with corresponding noncritical multiplex control structures.

11. The method of claim 10 further comprising a step of generating as output a second register transfer level code for the integrated circuit design with the corresponding noncritical multiplex control structures.

12. The method of claim 8 further comprising including a variable and a threshold value for each variable in the criteria defining a critical multiplex control structure.

13. The method of claim 12 further comprising including a variable in the criteria defining a critical multiplex control structure for at least one of a number of buses, a number of signals per bus, a total number of signals, a number of register bank sources, a number of memory sources, a number of flip-flops, a number of start points, and a number of endpoints.

14. The method of claim 12 further comprising weighting the variable by a variable function of a priority value assigned to the variable.

15. A computer program product for optimizing register transfer level code for an integrated circuit design comprising a medium for embodying a computer program for input to a computer and a computer program embodied in the medium for causing the computer to perform steps of:

(a) receiving as input a first register transfer level code for the integrated circuit design;

(b) receiving as input criteria defining a critical multiplex structure;

(c) analyzing the first register transfer level code to identify all multiplex structures in the first register transfer level code;

(d) comparing each of the multiplex structures identified in the first register transfer level code to the criteria defining a critical multiplex structure;

(e) entering each of the multiplex structures identified in the first register transfer level code that satisfy the criteria defining a critical multiplex structure in a list of critical multiplex structures; and (f) generating as output the list of critical multiplex structures.

16. The computer program product of claim 15 further comprising a step of manually entering a multiplex structure in the list of critical multiplex structures.

17. The computer program product of claim 15 further comprising a step of replacing each of the multiplex structures in the list of critical multiplex structures with corresponding non-critical multiplex structures.

18. The computer program product of claim 17 further comprising a step of generating as output a second register transfer level code for the integrated circuit design with the corresponding non-critical multiplex structures.

19. The computer program product of claim 15 further comprising including a variable and a threshold value for each variable in the criteria defining a critical multiplex structure.

20. The computer program product of claim 19 further comprising including a variable in the criteria defining a critical multiplex structure for at least one of a number of buses, a number of signals per bus, a total number of signals, a number of register bank sources, a number of memory sources, a number of flip-flops, a number of start points, and a number of endpoints.

21. The computer program product of claim 19 further comprising weighting the variable by a variable function of a priority value assigned to the variable.

22. A computer program product for optimizing register transfer level code for an integrated circuit design comprising a medium for embodying a computer program for input to a computer and a computer program embodied in the medium for causing the computer to perform steps of:

(a) receiving as input a first register transfer level code for the integrated circuit design;

(b) receiving as input criteria defining a critical multiplex control structure;

(c) analyzing the first register transfer level code to identify multiplex control structures in the first register transfer level code;

(d) comparing each of the multiplex control structures identified in the first register transfer level code to the criteria defining a critical multiplex control structure;

(e) entering each of the multiplex control structures identified in the first register transfer level code that satisfy the criteria defining a critical multiplex control structure in a list of critical multiplex control structures; and (f) generating as output the list of critical multiplex control structures.

23. The computer program product of claim 22 further comprising a step of manually entering a multiplex control structure in the list of critical multiplex control structures.

24. The computer program product of claim 22 further comprising a step of replacing each of the multiplex control structures in the list of critical multiplex control structures with corresponding non-critical multiplex control structures.

25. The computer program product of claim 24 further comprising a step of generating as output a second register transfer level code for the integrated circuit design with the corresponding non-critical multiplex control structures.

26. The computer program product of claim 22 further comprising including a variable and a threshold value for each variable in the criteria defining a critical multiplex control structure.

27. The computer program product of claim 26 further comprising including a variable in the criteria defining a critical multiplex control structure for at least one of a number of buses, a number of signals per bus, a total number of signals, a number of register bank sources, a number of memory sources, a number of flip-flops, a number of start points, and a number of endpoints.

28. The computer program product of claim 26 further comprising weighting the variable by a variable function of a priority value.

* * * * *